(12) United States Patent
Hoshino et al.

(10) Patent No.: US 10,903,081 B2
(45) Date of Patent: Jan. 26, 2021

(54) SUBSTRATE PROCESSING METHOD

(71) Applicant: Tokyo Electron Limited, Tokyo (JP)

(72) Inventors: Tomohisa Hoshino, Nirasaki (JP); Keiichi Fujita, Nirasaki (JP); Masato Hamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/857,774

(22) Filed: Dec. 29, 2017

(65) Prior Publication Data

US 2018/0122641 A1 May 3, 2018

Related U.S. Application Data

(62) Division of application No. 15/373,724, filed on Dec. 9, 2016, now abandoned.

(30) Foreign Application Priority Data

Dec. 11, 2015 (JP) .................. 2015-242609

(51) Int. Cl.
| | |
|---|---|
| *C23C 18/16* | (2006.01) |
| *C23C 18/18* | (2006.01) |
| *C23C 18/40* | (2006.01) |
| *H01L 21/288* | (2006.01) |
| *H01L 21/768* | (2006.01) |
| *C25D 7/12* | (2006.01) |
| *H01L 21/3205* | (2006.01) |

(52) U.S. Cl.
CPC ........ *H01L 21/288* (2013.01); *C23C 18/1619* (2013.01); *C23C 18/1633* (2013.01); *C23C 18/1675* (2013.01); *C23C 18/1879* (2013.01); *C25D 7/123* (2013.01); *H01L 21/32051* (2013.01); *H01L 21/76873* (2013.01); *H01L 21/76874* (2013.01); *H01L 21/76898* (2013.01); *C23C 18/1653* (2013.01); *C23C 18/1696* (2013.01); *C23C 18/40* (2013.01)

(58) Field of Classification Search
CPC ...................................................... C23C 18/16
USPC ... 427/97.9, 99.5, 304, 305, 306, 437, 443.1
See application file for complete search history.

(56) References Cited

U.S. PATENT DOCUMENTS

| 4,248,632 A | * | 2/1981 | Ehrich .................... C07F 17/00 |
| | | | 106/1.11 |
| 5,503,877 A | * | 4/1996 | Stamp .................... C08G 85/00 |
| | | | 427/328 |

(Continued)

FOREIGN PATENT DOCUMENTS

JP 2002-302773 A 10/2002

*Primary Examiner* — Dah-Wei D. Yuan
*Assistant Examiner* — Nga Leung V Law
(74) *Attorney, Agent, or Firm* — Pearne & Gordon LLP

(57) ABSTRACT

A substrate processing method is provided for performing a plating processing on a substrate having, on a surface thereof, an impurity-doped polysilicon film containing a high concentration of impurities. The substrate processing method includes forming a catalyst layer by supplying, onto the substrate, an alkaline catalyst solution containing a complex of a palladium ion and a monocyclic 5- or 6-membered heterocyclic compound having one or two nitrogen atoms as a heteroatom; and forming a plating layer through electroless plating by supplying a plating liquid onto the substrate after the forming of the catalyst layer.

4 Claims, 3 Drawing Sheets

(56) References Cited

U.S. PATENT DOCUMENTS

| | | | |
|---|---|---|---|
| 6,030,877 A * | 2/2000 | Lee | H01L 27/08 |
| | | | 257/295 |
| 2002/0043466 A1 | 4/2002 | Dordi et al. | |
| 2004/0087148 A1 * | 5/2004 | Wong | H01L 21/76843 |
| | | | 438/687 |
| 2015/0004323 A1 * | 1/2015 | Milum | B01J 31/28 |
| | | | 427/404 |
| 2017/0042039 A1 * | 2/2017 | Liu | C23C 18/30 |
| 2017/0167029 A1 | 6/2017 | Hoshino et al. | |

* cited by examiner

SUBSTRATE PROCESSING METHOD

CROSS-REFERENCE TO RELATED APPLICATION

This is a divisional application of U.S. patent Application Ser. No. 15/373,724, filed on Dec. 9, 2016 which claims the benefit of Japanese Patent Application No. 2015-242609 filed on Dec. 11, 2015, the entire disclosures of which are incorporated herein by reference.

TECHNICAL FIELD

The embodiments described herein pertain generally to a substrate processing method.

BACKGROUND

Recently, a semiconductor device such as a LSI is required to be more highly densified to meet such requirements as reduction of a footprint (mounting space) or improvement of a processing rate. As an example of technology for achieving the high densification, there is known a multilayer wiring technology of manufacturing a multilayer substrate such as a three-dimensional LSI by stacking a multiple number of wiring substrates.

Generally, in the multilayer wiring technology, a through-via-hole (TSV (Through Silicon Via)) in which a conductive material such as copper is buried is formed to penetrate each wiring substrate to achieve electrical conduction between the wiring substrates. As an example of a technology for forming the TSV in which the conductive material is buried, there is known an electroless plating method.

In case of forming a plating layer by electroless plating, it is needed to improve adhesivity between an underlying layer and the plating layer. As an example of a technique for improving the adhesivity between the underlying layer and the plating layer, there is known a method in which metal catalyst particles such as palladium serving as a catalyst for forming the plating layer are coupled to the underlying layer, and the plating layer is formed through the electroless plating by using the catalyst as a base of a plating reaction. If, however, it is attempted to couple the metal catalyst particles such as palladium to the underlying layer directly, the metal catalyst particles may be aggregated depending on a material of the underlying layer, so that the metal catalyst particles may not be coupled to the underlying layer with a sufficiently high uniformity enough to form the plating layer. As a result, the metal catalyst particles may not function as the catalyst sufficiently so that the plating layer may not be formed efficiently, or the aggregated metal catalyst particles may become a hindrance to a manufacture of a multilayer substrate.

As an example of a technique for suppressing such aggregation of the metal catalyst particles, there is known a method in which a self-assembled monolayer (SAM) is formed on the underlying layer by an underlying layer processing with a coupling agent such as a silane coupling agent, and the metal catalyst particles such as palladium are coupled to the underlying layer with the self-assembled monolayer therebetween (see, for example, Patent Document 1).

Patent Document 1: Japanese Patent Laid-open Publication No. 2002-302773

In case that the underlying layer on which the plating layer is formed is an impurity-doped polysilicon film containing a high concentration of impurities, when it is attempted to couple the metal catalyst particles to the impurity-doped polysilicon film, the aggregation of the metal catalyst particles such as palladium may occur conspicuously. As a result, the metal catalyst particles may not perform the function as the catalyst sufficiently, so that the plating layer may not be formed sufficiently by a subsequent electroless plating. Further, the aggregated metal catalyst particles may become a hindrance when manufacturing a multilayer substrate. Meanwhile, in case of performing the film (layer) forming with the silane coupling agent (i.e., silane coupling processing) as the underlying layer processing, since the layer of the silane coupling agent may not necessarily be a monolayer, the metal catalyst particles such as palladium used as the catalyst for forming the plating layer may be covered with the silane coupling agent, so that the metal catalyst particles coupled to the underlying layer may not sufficiently function as the catalyst for forming the plating layer and the plating layer may not be formed efficiently.

SUMMARY

In view of the foregoing, exemplary embodiments provide a substrate processing apparatus and a substrate processing method capable of forming, without performing a silane coupling processing, a catalyst layer on a substrate, which has an impurity-doped polysilicon film containing a high concentration of impurities on a surface thereof, by allowing palladium atoms to be coupled to the impurity-doped polysilicon film of the substrate without being aggregated. Further, the exemplary embodiments also provide a recording medium having stored thereon a program for implementing this substrate processing method.

The present inventors have reached the present disclosure by finding out that, without performing a silane coupling processing on a substrate having an impurity-doped polysilicon film containing a high concentration of impurities on a surface thereof, a catalyst layer can be formed on the substrate by allowing palladium atoms to be coupled to the impurity-doped polysilicon film of the substrate without being aggregated by using an alkaline liquid, as a catalyst solution, containing a complex of a palladium ion and a monocyclic 5- or 6-membered heterocyclic compound having one or two nitrogen atoms as a heteroatom. Further, the present inventors have found out that, by observing with a scanning electron microscope and by an X-ray photoelectron spectroscopy (XPS) analysis, the palladium atoms are actually coupled to the impurity-doped polysilicon film of the substrate without being aggregated by forming the catalyst layer with this catalyst solution even if the siliane coupling processing is not performed on the substrate. Furthermore, it is also actually observed that a plating layer is formed by electroless plating on the catalyst layer which is formed on the substrate by using the aforementioned catalyst solution.

The present disclosure includes following exemplary embodiments.

(1) A substrate processing method of performing a plating processing on a substrate having, on a surface thereof, an impurity-doped polysilicon film containing a high concentration of impurities, the substrate processing method comprising:

forming a catalyst layer by supplying, onto the substrate, an alkaline catalyst solution containing a complex of a palladium ion and a monocyclic 5- or 6-membered heterocyclic compound having one or two nitrogen atoms as a heteroatom; and forming a plating layer through electroless plating by supplying a plating liquid onto the substrate after the forming of the catalyst layer.

(2) The substrate processing method as described in (1), wherein the substrate further includes a base member and an insulating film formed between the base member and the impurity-doped polysilicon film.

(3) The substrate processing method as described in (1) or (2), wherein the heterocyclic compound is selected from a group consisting of pyrroline, pyrrole, imidazoline, imidazole, pyrazoline, pyrazole, pyridine, pyridazine, pyrimidine, pyrazine, pyrrolidine, imidazolidine, pyrazolidine, piperidine and piperazine.

(4) The substrate processing method as described in any one of (1) to (3), wherein the heterocyclic compound has a substituent selected from a group consisting of a hydroxyl group, a carboxyl group and a sulfate group.

According to the exemplary embodiments as stated above, it is possible to provide a substrate processing method capable of forming, without performing a silane coupling processing, a catalyst layer on a substrate having an impurity-doped polysilicon film containing a high concentration of impurities on a surface thereof, by allowing palladium atoms to be coupled to the impurity-doped polysilicon film of the substrate without being aggregated.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
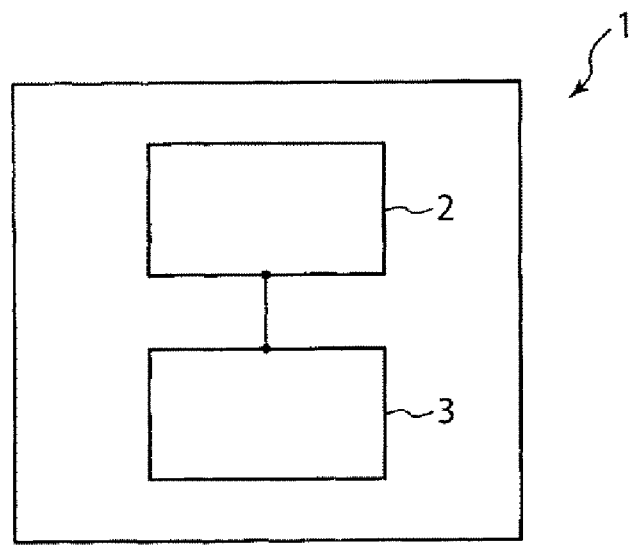
FIG. 1 is a schematic diagram illustrating a configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Configuration of Substrate Processing Apparatus

Referring to FIG. 1, a configuration of a substrate processing apparatus according to an exemplary embodiment will be explained. FIG. 1 is a schematic diagram illustrating the configuration of the substrate processing apparatus according to the exemplary embodiment.

As depicted in FIG. 1, the substrate processing apparatus 1 according to the exemplary embodiment includes a substrate processing unit 2 and a controller 3 configured to control an operation of the substrate processing unit 2.

The substrate processing unit 2 is configured to perform various processings on a substrate. The various processings performed by the substrate processing unit 2 will be described later.

The controller 3 is implemented by, for example, a computer, and includes a main controller and a storage unit. The main controller is implemented by, for example, a CPU (Central Processing Unit) and is configured to control the operation of the substrate processing unit 2 by reading and executing a program stored in the storage unit. The storage unit is implemented by a storage device such as, but not limited to, a RAM (Random Access Memory), a ROM (Read Only Memory) or a hard disk, and stores thereon a program for controlling various processings performed in the substrate processing unit 2. Further, the program may be recorded in a computer-readable recording medium, or may be installed from the recording medium to the storage unit. The computer-readable recording medium may be, for example, a hard disc (HD), a flexible disc (FD), a compact disc (CD), a magnet optical disc (MO), or a memory card. The recording medium has stored thereon a program that, when executed by a computer for controlling an operation of the substrate processing apparatus 1, causes the substrate processing apparatus 1 to perform a substrate processing method to be described later under the control of the computer.

Configuration of Substrate Processing Unit

Figure 2:
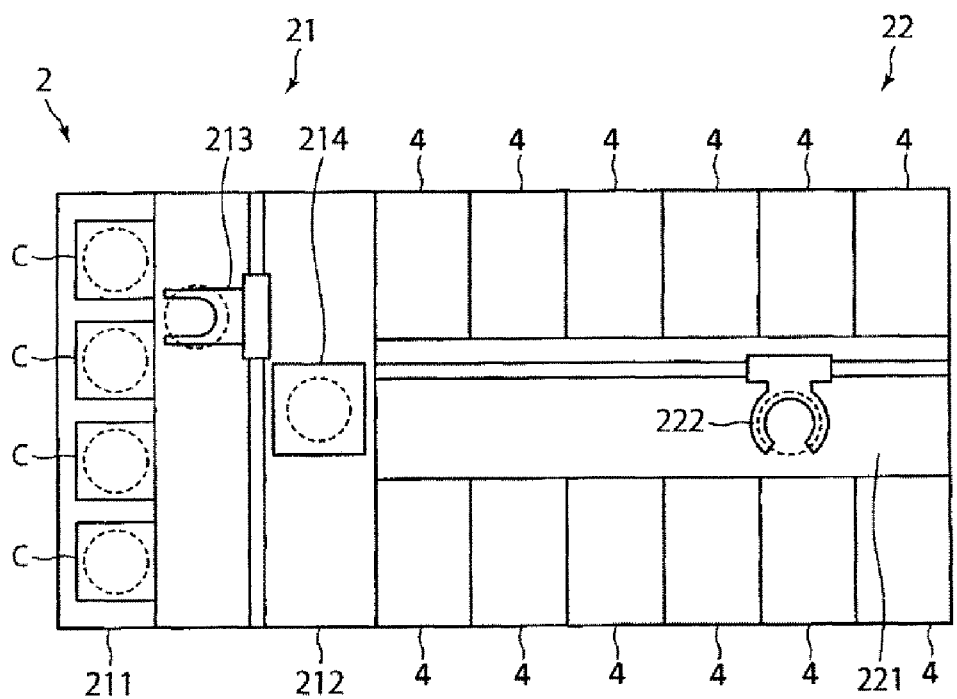
FIG. 2 is a schematic plan view illustrating a configuration of a substrate processing unit provided in the substrate processing apparatus shown in FIG. 1.

Referring to FIG. 2, a configuration of the substrate processing unit 2 will be discussed. FIG. 2 is a schematic plan view illustrating the configuration of the substrate processing unit 2. In FIG. 2, dashed lines indicate substrates.

The substrate processing unit 2 is configured to perform various processings on the substrate. A processing performed by the substrate processing unit 2 is not particularly limited as long as it includes: catalyst layer forming processing of forming a catalyst layer on a substrate, which has an impurity-doped polysilicon film formed on a surface thereof and containing a high concentration of impurities, with an alkaline catalyst solution (hereinafter, referred to as "catalyst solution of present disclosure" or simply "catalyst solution") containing a complex of a palladium ion and a monocyclic 5- or 6-membered aromatic or aliphatic heterocyclic compound having one or two nitrogen atoms as a heteroatom; and electroless plating processing of forming an electroless plating layer on the catalyst layer which is formed by the catalyst layer forming processing. Further, in the catalyst layer forming processing, the catalyst layer is formed on the impurity-doped polysilicon film of the substrate. The processing performed by the substrate processing unit 2 may include various other processings as well as the catalyst layer forming processing and the electroless plating processing performed after the catalyst layer forming processing. These various other processings may include, for example, process processing, cleaning processing, rinsing processing, baking processing, electroless copper (Cu) plating processing, electrolytic copper (Cu) plating processing, and so forth. The process processing may include a recess forming processing of forming a recess for forming a conductive layer on a base member, a film forming processing of forming an impurity-doped polysilicon film at at least one main surface side (e.g., main surface side where the recess is formed) of the base member, and so forth. The forming processing is performed before the catalyst layer forming processing, for example. The cleaning processing is a processing of cleaning the substrate with a cleaning liquid and is performed before and/or after the catalyst layer forming processing, for example. The rinsing processing is a processing of washing away various liquids remaining on the substrate with a rinse liquid and is performed before subsequent processing is performed after the cleaning processing. The baking processing is a processing of baking the electroless plating layer which is formed on the catalyst layer by the electroless plating processing. The electroless Cu plating processing is a processing of forming an electroless Cu plating layer on the electroless plating layer which is formed on the catalyst layer by the electroless plating processing. The formed electroless Cu plating layer serves as a seed layer when performing the electrolytic Cu plating processing. The electrolytic Cu plating processing is a processing of forming an electrolytic Cu plating layer on the electroless Cu plating layer (seed layer) which is formed by the electroless Cu plating processing. One or more of these various other processings may be performed in combinations.

In the present exemplary embodiment, a substrate having a recess previously formed on a surface thereof is carried into the substrate processing unit 2, and the various processings are performed on the substrate. However, a base member on which the process processing is not performed may be carried into the substrate processing unit 2, and a substrate may be prepared by performing the process processing of forming the recess on the surface of the base member, a film forming processing of forming an impurity-doped polysilicon film at at least one main surface side (e.g., at the main surface side where the recess is formed) of the base member, etc., in the substrate processing unit 2. Then, the various processings may be performed. According to the present exemplary embodiment, the substrate processing unit 2 is configured to perform a processing including the catalyst layer forming processing of forming the catalyst layer on a surface of the substrate with the catalyst solution of the present disclosure and the electroless plating processing of forming the electroless plating layer on the catalyst layer which is formed on the surface of the substrate by the catalyst layer forming processing.

The substrate processing unit 2 includes a carry-in/out station 21; and a processing station 22 provided adjacent to the carry-in/out station 21.

The carry-in/out station 21 includes a placing section 211; and a transfer section 212 provided adjacent to the placing section 211.

In the placing section 211, a plurality of transfer containers (hereinafter, referred to as "carriers C") is placed to accommodate a plurality of substrates horizontally.

The transfer section 212 is provided with a transfer device 213 and a delivery unit 214. The transfer device 213 is provided with a holding mechanism configured to hold a substrate. The transfer device 213 is configured to be movable horizontally and vertically, and pivotable around a vertical axis.

The processing station 22 includes a plurality of plating units 4 configured to perform a processing including the catalyst layer forming processing and the electroless plating processing on the substrate. In the present exemplary embodiment, the number of the plating units 4 provided in the processing station 22 may be two or more, but it is also possible to provide only one plating unit 4. In the present exemplary embodiment, the plating units 4 are arranged at both sides of a transfer path 211 which is extended in a preset direction. However, the plating units 4 may be arranged at one side of the transfer path 221. Furthermore, the substrate processing unit 2 may be further equipped with a process processing unit, a baking unit, an electroless Cu plating unit, an electrolytic Cu plating unit, and so forth, which are configured to perform the aforementioned process processing, baking processing, electroless Cu plating processing and electrolytic Cu plating processing, respectively.

The transfer path 221 is provided with a transfer device 222. The transfer device 222 includes a holding mechanism configured to hold the substrate, and is configured to be movable horizontally and vertically, and pivotable around the vertical axis.

Figure 4A:
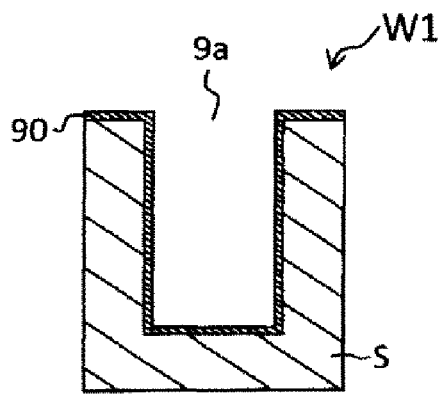
FIG. 4A to FIG. 4F are diagrams illustrating a process of a substrate processing method performed by the substrate processing apparatus shown in FIG. 1.
Figure 4B:
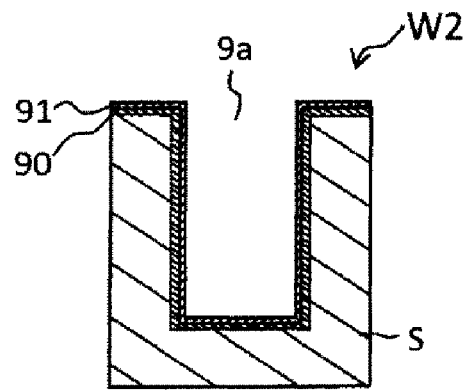
Figure 4C:
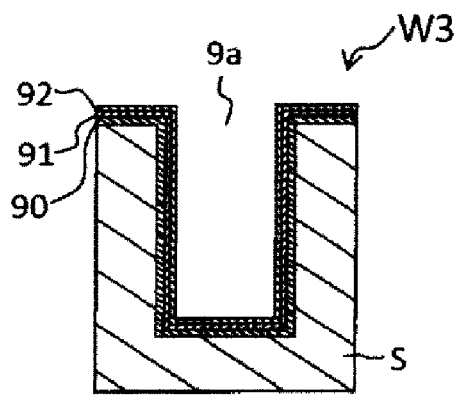
Figure 4D:
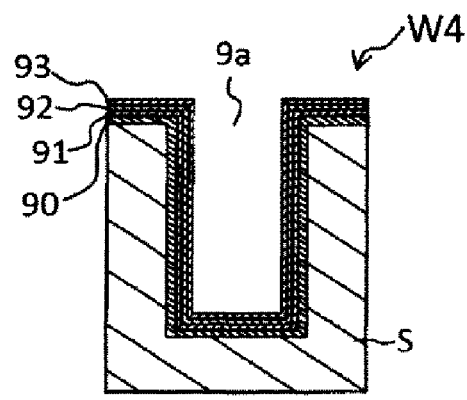
Figure 4E:
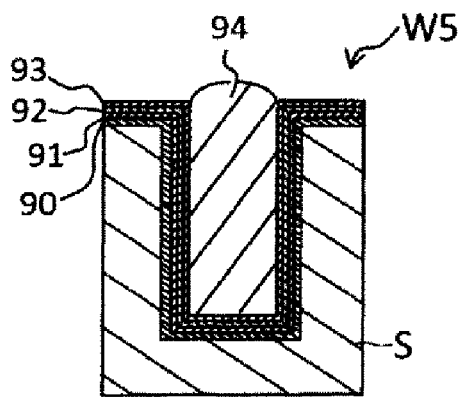
Figure 4F:
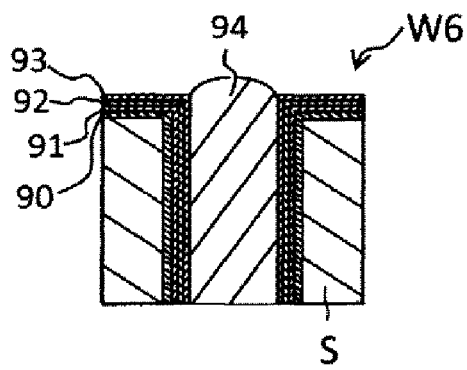

Now, as shown in FIG. 4A to FIG. 4F, an initial substrate obtained before a substrate processing in the plating unit 4 (i.e., a substrate as a target of the substrate processing performed by the plating unit 4) is referred to as "substrate W1" (FIG. 4A); a substrate obtained after the catalyst layer forming processing of forming a catalyst layer 91 on the surface of the substrate W1 is referred to as "substrate W2" (FIG. 4B); and a substrate obtained after the electroless plating processing of forming an electroless plating layer 92 on the catalyst layer of the substrate W2 is referred to as "substrate W3" (FIG. 4C). Further, in case that various other processings are performed on the substrate W3 obtained after the electroless plating processing, a substrate obtained after the electroless Cu plating processing of forming an electroless Cu plating layer 93 on the electroless plating layer of the substrate W3 is referred to as "substrate W4" (FIG. 4D); a substrate obtained after the electrolytic Cu plating processing of filing a recess of the substrate W4 with an electrolytic Cu plating 94 is referred to as "substrate W5" (FIG. 4E); and a substrate obtained after a chemical mechanical polishing processing of polishing a rear surface side (i.e., opposite from the surface where the recess is formed) of the substrate W5 is referred to as "substrate W6" (FIG. 4F).

In the substrate processing unit 2, the transfer device 213 of the carry-in/out station 21 is configured to transfer the substrates W1 and W3 between the carriers C and the delivery unit 214. To elaborate, the transfer device 213 takes out the substrate W1 from the carrier C placed in the placing section 211, and then, places the substrate W1 in the delivery unit 214. Further, the transfer device 213 takes out the substrate W3 which is placed in the delivery unit 214 by the transfer device 222 of the processing station 22, and then, accommodates the substrate W3 in the carrier C of the placing section 211.

In the substrate processing unit 2, the transfer device 222 of the processing station 22 is configured to transfer the substrates W1 and W3 between the delivery unit 214 and the plating unit 4. To elaborate, the transfer device 222 takes out the substrate W1 placed in the delivery unit 214, and then, carries the substrate W1 into the plating unit 4. Further, the transfer device 222 takes out the substrate W3 from the plating unit 4, and then, places the substrate W3 in the delivery unit 214.

Configuration of Plating Unit

Figure 3:
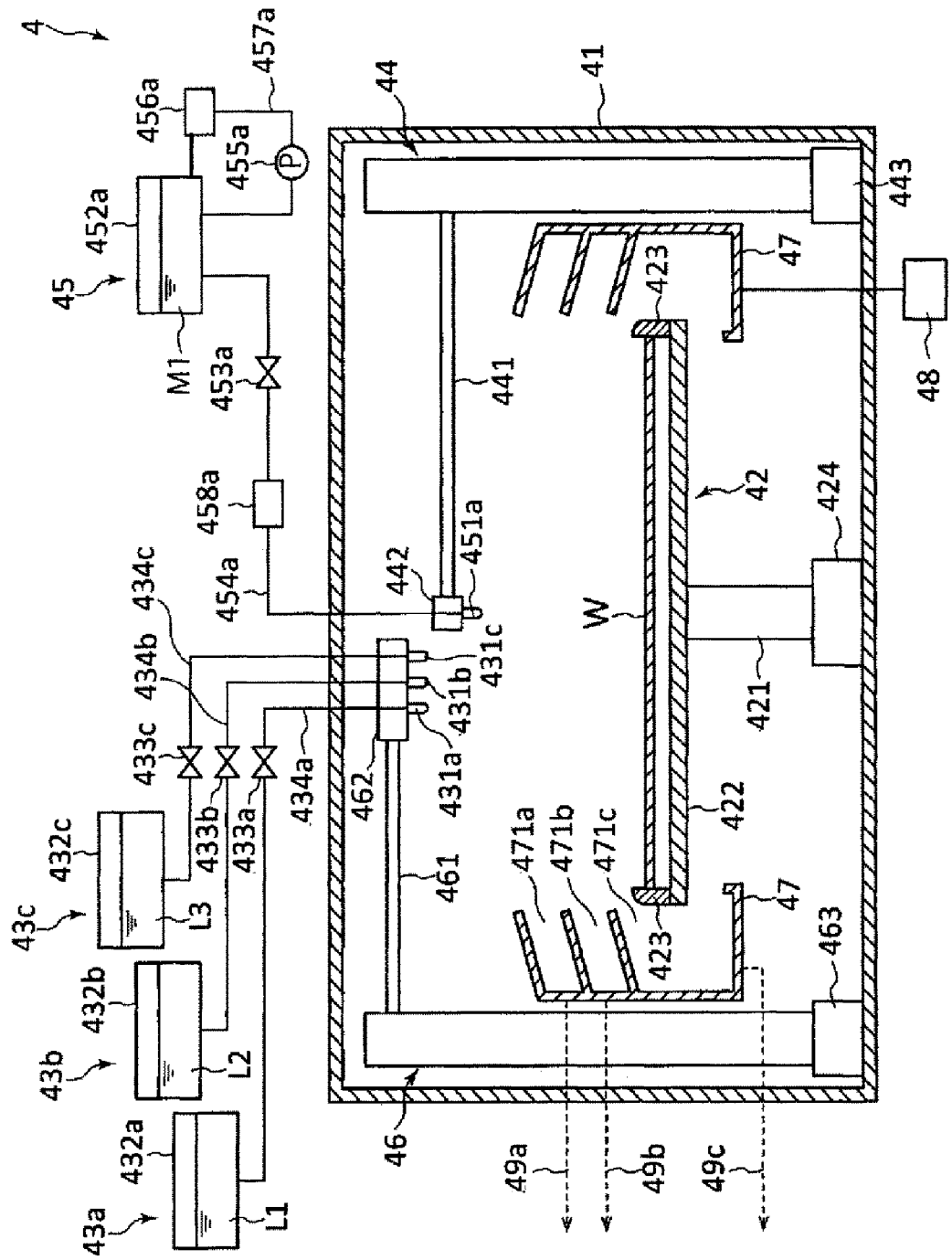
FIG. 3 is a schematic cross sectional view illustrating a configuration of a plating unit provided in the substrate processing unit shown in FIG. 2.

Now, a configuration of the plating unit 4 will be explained with reference to FIG. 3. FIG. 3 is a schematic cross sectional view illustrating the configuration of the plating unit 4. In FIG. 3, "W" denotes any one of the aforementioned substrates W1 to W3 according to a processing stage of a substrate.

The plating unit 4 is configured to perform a processing including: the catalyst layer forming processing of forming the catalyst layer on the surface of the substrate W1 by using the catalyst solution of the present disclosure; and the electroless plating processing of forming the electroless plating layer on the catalyst layer of the substrate W2 obtained after the catalyst layer forming processing. Further, the processing performed by the plating unit 4 is not particularly limited as long as it includes the catalyst layer forming processing of forming the catalyst layer on the surface of the substrate W1 by using the catalyst solution of the present disclosure and the electroless plating processing of forming the electroless plating layer on the catalyst layer of the substrate W2 obtained after the catalyst layer forming processing. Thus, the processing performed by the plating unit 4 may include various other processings besides the catalyst layer forming processing and the electroless plating processing which is conducted after the catalyst layer forming processing. According to the present exemplary embodiment, the plating unit 4 is equipped with a cleaning liquid supply unit 43b and a rinse liquid supply unit 43c as well as a catalyst solution supply unit 43a configured to perform the catalyst layer forming processing on the surface of the substrate W1 by supplying the catalyst solution onto the substrate W1 and a plating liquid supply unit 45 configured to form the electroless plating layer on the catalyst layer of the substrate W2 by supplying a plating liquid for forming the electroless plating layer on the substrate W2 obtained after the catalyst layer forming processing. The cleaning liquid supply unit 43b is configured to supply a cleaning liquid for cleaning the substrate, and the rinse liquid supply unit 43c is configured to supply a rinse liquid for washing away various liquids remaining on the substrate. The cleaning liquid supply unit 43b and the rinse liquid supply unit 43c may be provided or may not be provided, and the processings performed by these supply units may be performed by other units.

The substrate W1 is not particularly limited as long as it has an impurity-doped polysilicon film containing a high concentration of impurities on a surface thereof. As an example, a substrate having a base member and an impurity-doped polysilicon film formed at at least one main surface side of the base member may be used as the substrate W1. By way of example, a silicon wafer or the like may be used as the base member. The base member may be provided with a recess. In case that the base member has the recess, it is desirable that the impurity-doped polysilicon film is formed at a main surface side of the base member where the recess is formed. The impurity-doped polysilicon film may be directly formed on at least one main surface of the base member, or may be formed at at least one main surface side of the base member with an intermediate layer therebetween. That is, the substrate W1 may have an intermediate layer formed between the base member and the impurity-doped polysilicon film. The intermediate layer may be implemented by, by way of example, an insulating film, and the insulating film may be an interlayer insulating film such as a $SiO_2$ film, a SiN film, or a low dielectric film called a Low-k film. The Low-k film may be a film having a dielectric constant lower than a dielectric constant of silicon dioxide, for example, a SiOC film. Further, the impurities contained in the impurity-doped polysilicon film may not be particularly limited as long as it applies electric conductivity to the polysilicon film. The impurities may be, by way of example, but not limitation, atoms of elements having a valence of 3, e.g., boron, atoms of elements having a valence of 5, e.g., phosphorous, or the like. The impurities contained in the impurity-doped polysilicon film may be one kind of atoms or may be two or more kinds of atoms. Further, regarding the amount of the impurities contained in the impurity-doped polysilicon film, the term "high concentration" means that the number of atoms as the impurities is equal to or higher than $10^{15}$ per 1 $cm^3$ of the impurity-doped polysilicon film ($10^{15}/cm^3$). The amount of the impurities contained in the impurity-doped polysilicon film is not particularly limited as long as it is not less than $10^{15}/cm^3$. In case that multiple kinds of atoms are contained as the impurities, the aforementioned number of the impurity atoms implies a sum of the individual numbers of the multiple kinds of atoms.

The plating unit 4 includes a chamber 41, and is configured to perform a substrate processing including the catalyst layer forming processing and the electroless plating processing within the chamber 41.

The plating unit 4 is provided with a substrate holding unit 42. The substrate holding unit 42 includes a rotation shaft 421 extended in the vertical direction within the chamber 41; a turntable 422 provided at an upper end portion of the rotation shaft 421; a chuck 423 provided on an outer peripheral portion of a top surface of the turntable 422 and configured to support an edge portion of the substrate W1; and a driving unit 424 configured to rotate the rotation shaft 421.

The substrate W1 is supported by the chuck 423 to be horizontally held by the turntable 422 while being slightly spaced apart from the top surface of the turntable 422. In the present exemplary embodiment, a mechanism of holding the substrate W1 by the substrate holding unit 42 is of a so-called mechanical chuck type in which the edge portion of the substrate W1 is held by the chuck 423 which is configured to be movable. However, a so-called vacuum chuck type of vacuum attracting a rear surface of the substrate W1 may be employed instead.

A base end portion of the rotation shaft 421 is rotatably supported by the driving unit 424, and a tip end portion of the rotation shaft 421 sustains the turntable 422 horizontally. If the rotation shaft 421 is rotated, the turntable 422 placed on the upper end portion of the rotation shaft 421 is rotated, and, as a result, the substrate W1 which is held on the turntable 422 by the chuck 423 is also rotated. The controller 3 controls an operation of the driving unit 424 to adjust, e.g., a rotation timing and a rotational speed of the substrate W1.

The plating unit 4 is equipped with the catalyst solution supply unit 43a, the cleaning liquid supply unit 43b and the rinse liquid supply unit 43c configured to respectively supply a catalyst solution L1, a cleaning liquid L2 and a rinse liquid L3 onto the substrate W1 held by the substrate holding unit 42.

The catalyst solution supply unit 43a includes a nozzle 431a configured to discharge the catalyst solution L1 onto the substrate W1 held by the substrate holding unit 42; and a catalyst solution supply source 432a configured to supply the catalyst solution L1 to the nozzle 431a. The catalyst solution L1 is stored in a tank of the catalyst solution supply source 432a, and the catalyst solution L1 is supplied to the nozzle 431a from the catalyst solution supply source 432a through a supply passageway 434a which is provided with a flow rate controller such as a valve 433a.

The cleaning liquid supply unit 43b includes a nozzle 431b configured to discharge the cleaning liquid L2 onto the substrate W1 held by the substrate holding unit 42; and a cleaning liquid supply source 432b configured to supply the cleaning liquid L2 to the nozzle 431b. The cleaning liquid L2 is stored in a tank of the cleaning liquid supply source 432b, and the cleaning liquid L2 is supplied to the nozzle 431b from the cleaning liquid supply source 432b through a supply passageway 434b which is provided with a flow rate controller such as a valve 433b.

The rinse liquid supply unit 43c includes a nozzle 431c configured to discharge the rinse liquid L3 onto the substrate W1 held by the substrate holding unit 42; and a rinse liquid supply source 432c configured to supply the rinse liquid L3 to the nozzle 431c. The rinse liquid L3 is stored in a tank of the rinse liquid supply source 432c, and the rinse liquid L3 is supplied to the nozzle 431c from the rinse liquid supply source 432c through a supply passageway 434c which is provided with a flow rate controller such as a valve 433c.

The catalyst solution L1, the cleaning liquid L2 and the rinse liquid L3 are liquids for pre-processings that are performed prior to the electroless plating processing with the plating liquid M1.

The catalyst solution L1 as the catalyst solution of the present disclosure contains a complex of a palladium ion and a monocyclic 5- or 6-membered aromatic or aliphatic heterocyclic compound having one or two nitrogen atoms as a heteroatom, and is adjusted to be alkaline. Here, "alkaline" means that a pH thereof is higher than 7. Desirably, it implies a pH 8 to a pH 14, and, more desirably, a pH 8 to a pH 12. By adjusting the pH within this range, the complex of the heterocyclic compound and the palladium ion can be easily formed. By using the catalyst solution containing this complex, it is possible to allow palladium atoms to be coupled to the impurity-doped polysilicon film of the substrate without being aggregated, so that a catalyst layer can be formed without performing the processing with the silane coupling agent. Among the heterocyclic compound constituting the complex together with the palladium ion, the 5-membered aromatic compound may be, by way of non-limiting example, pyrroline, pyrrole, imidazoline, imidazole, pyrazoline, pyrazole, etc., and the 6-membered aromatic compound may be, by way of non-limiting example, pyridine, pyridazine, pyrimidine, pyrazine, etc. Further, the 5-membered aliphatic compound may be, by way of example, pyrrolidine, imidazolidine, pyrazolidine, etc., and the 6-membered aliphatic compound may be, by way of non-limiting example, piperidine, piperazine, etc. If the heterocyclic compound has position isomers, the individual position isomers are also included. Further, the heterocyclic compound may have a substituent. It is desirable that the substituent is a hydrophilic group. The hydrophilic group may be, for example, a hydroxyl group, a carboxyl group, a sulfate group, or the like. A palladium ion source which supplies the palladium ions that constitute the complex is not particularly limited as long as it is capable of supplying the palladium ions. As such a palladium ion source, palladium salt such as palladium chloride may be used. Further, a solvent of the catalyst solution L1 is not particularly limited, either, as long as it is capable of ionizing palladium. As an example of the solvent of the catalyst solution L1, a polar solvent capable of generating the palladium ions by dissolving the palladium salt may be used. The polar solvent may be an organic polar solvent or an inorganic polar solvent. Desirably, the polar solvent may be water such as pure water.

Further, in case that the substrate W1 has the recess, it is desirable to adjust a viscosity coefficient of the catalyst solution L1 to diffuse the catalyst solution L1 sufficiently to a lower portion of the recess.

As an example of the cleaning liquid L2, a malic acid, a succinic acid, a citric acid or a malonic acid may be used.

As an example of the rinse liquid L3, pure water may be used.

The plating unit 4 includes a nozzle moving mechanism 46 configured to move the nozzles 431a to 431c. The nozzle moving mechanism 46 is equipped with an arm 461; a moving body 462 which is configured to be movable along the arm 461 and has a moving mechanism embedded therein; and a rotating/elevating mechanism 463 configured to rotate and move the arm 461 up and down. The nozzles 431a to 431c are provided at the moving body 462. The nozzle moving mechanism 46 is capable of moving the nozzles 431a to 431c between a position above the central portion of the substrate W1 held by the substrate holding unit 42 and a position above the peripheral portion of the substrate W1, and also capable of moving the nozzles 431a to 431c up to a stand-by position outside a cup 47 to be described later. In the present exemplary embodiment, though the nozzles 431a to 431c are held by the common arm, they may be configured to be held by different arms and moved independently.

The plating unit 4 includes a plating liquid supply unit 45 configured to supply the plating liquid M1 onto the substrate W1 which is held by the substrate holding unit 42. The plating liquid supply unit 45 is equipped with a nozzle 451a configured to discharge the plating liquid M1 toward the substrate W1 held by the substrate holding unit 42; and a plating liquid supply source 452a configured to supply the plating liquid M1 to the nozzle 451a. The plating liquid M1 is stored in a tank of the plating liquid supply source 452a, and the plating liquid M1 is supplied into the nozzle 451a through a supply passageway 454a.

The plating liquid M1 is an autocatalytic (reduction) plating liquid for electroless plating. The plating liquid M1 contains a metal ion such as a cobalt (Co) ion, a nickel (Ni) ion, a tungsten (W) ion; and a reducing agent such as hypophosphorous acid or dimethylamineborane. Further, in the autocatalytic (reduction) electroless plating, the metal ion in the plating liquid M1 is reduced by the electrons emitted in an oxidation reaction of the reducing agent in the plating liquid M1 and a metal layer is precipitated. The plating liquid M1 may further contain an additive or the like. The metal layer (plating layer) formed by the plating with the plating liquid M1 may be, by way of non-limiting example, CoWB, CoB, CoWP, CoWBP, NiWB, NiB, NiWP, NiWBP, or the like. P in the plating layer is originated from the reducing agent (e.g., hypophosphorous acid) containing P, and B in the plating layer is originated from the reducing agent (e.g., dimethylamineborane) containing B.

A circulation passageway 457a provided with a pump 455a and a first heating unit 456a is connected to the tank of the plating liquid supply source 452a. The plating liquid M1 in the tank is heated to a storage temperature while being circulated through the circulation passageway 457a. Here, the "storage temperature" refers to a temperature higher than a room temperature and lower than a temperature (plating temperature) where the precipitation of the metal ion in the plating liquid M1 progresses through a self-reaction.

The supply passageway 454a is provided with a second heating unit 458a configured to heat the plating liquid M1 to a discharge temperature higher than the storage temperature. The second heating unit 458a is further configured to heat the plating liquid M1, which has been heated to the storage temperature by the first heating unit 456a, up to the discharge temperature. Here, the "discharge temperature" refers to a temperature equal to or higher than the aforementioned plating temperature.

In the present exemplary embodiment, the plating liquid M1 is heated to a temperature equal to or higher than the plating temperature in two stages by the first heating unit 456a and the second heating unit 458a. Thus, as compared to the case where the plating liquid M1 is heated to the temperature higher than the plating temperature within the tank, evaporation of the components, deactivation of the reducing agent in the plating liquid M1 or the like can be suppressed. Therefore, a lifetime of the plating liquid M1 can be lengthened. Further, as compared to the case where the plating liquid M1 is stored at the room temperature within the tank and then heated to the temperature equal to or higher than the plating temperature by the second heating unit 458a later, it is possible to heat the plating liquid M1 to the temperature equal to or higher than the plating temperature rapidly with small energy, so that the precipitation of the metal ion can be suppressed.

Various kinds of chemical liquids are supplied into the tank of the plating liquid supply source 452a from a multiple number of chemical liquid supply sources (not shown) which store various kinds of components of the plating liquid M1. By way of example, chemical liquids such as a $CoSO_4$ metal salt containing a Co ion, a reducing agent (e.g., hypophosphorous acid, etc.), and an additive are supplied. At this time, flow rates of these chemical liquids are adjusted such that the components of the plating liquid M1 stored in the tank are appropriately controlled. A degassing unit (not shown) configured to remove dissolved oxygen and dissolved hydrogen in the plating liquid M1 may be provided in the tank. The degassing unit is configured to supply an inert gas such as, but not limited to, a nitrogen gas into the tank and dissolve the inert gas such as the nitrogen gas in the plating liquid M1, so that the other gases such as the oxygen and the hydrogen previously dissolved in the plating liquid M1 may be discharged to the outside of the plating liquid M1. The gases such as the oxygen and the hydrogen discharged from the plating liquid M1 may be exhausted from the tank by an exhaust unit (not shown). The circulation passageway 457a may be provided with a filter (not shown). By providing the filter in the circulation passageway 457a, various kinds of impurities contained in the plating liquid M1 can be removed when the plating liquid M1 is heated by the first heating unit 456a. The circulation passageway 457a may be further provided with a monitoring unit (not shown) configured to monitor a characteristic of the plating liquid M1. The monitoring unit may be implemented by, for example, a temperature monitoring unit configured to monitor a temperature of the plating liquid M1, a pH monitoring unit configured to monitor a pH of the plating liquid M1, or the like.

The plating unit 4 is equipped with a nozzle moving mechanism 44 configured to move the nozzle 451a. The nozzle moving mechanism 44 includes an arm 441; a moving body 442 which is configured to be movable along the arm 441 and has a moving mechanism embedded therein; and a rotating/elevating mechanism 443 configured to rotate and move the arm 441 up and down. The nozzle 451a is provided at the moving body 442. The nozzle moving mechanism 44 is capable of moving the nozzle 451a between a position above a central portion of the substrate W1 held by the substrate holding unit 42 and a position above a peripheral portion of the substrate W1, and also capable of moving the nozzle 451a up to a stand-by position outside the cup 47 to be described later.

The plating unit 4 is equipped with the cup 47 having drain openings 471a, 471b and 471c. The cup 47 is disposed around the substrate holding unit 42, and is configured to collect various kinds of processing liquids (e.g., plating liquid, cleaning liquid, rinse liquid, catalyst solution, etc.) which are scattered from the substrate W1. The cup 47 is provided with an elevating mechanism 48 configured to move the cup 47 up and down; and liquid draining mechanisms 49a, 49b and 49c configured to collect and drain the various kinds of processing liquids scattered from the substrate W1 through the drain openings 471a, 471b and 471c, respectively. By way of example, the plating liquid M1 scattered from the substrate W1 is drained from the liquid draining mechanism 49a; the catalyst solution L1 scattered from the substrate W1 is drained from the liquid draining mechanism 49b; and the cleaning liquid L2 and the rinse liquid L3 scattered from the substrate W1 are drained from the liquid draining mechanism 49c.

Substrate Processing Method

Now, a substrate processing method performed by the substrate processing apparatus 1 will be discussed with reference to FIG. 4A to FIG. 4F. FIG. 4A to FIG. 4C are schematic cross sectional views illustrating a substrate on which the substrate processing method is performed. In FIG. 4A to FIG. 4F, "S" denotes the base member (e.g., silicon wafer), and "90" denotes the impurity-doped polysilicon film.

The substrate processing method is performed on a substrate W1 having a base member S provided with a recess 9a and an impurity-doped polysilicon film 90 formed on an outermost layer of one main surface side (main surface side where the recess 9a is formed) of the base member S by the substrate processing apparatus 1. The present substrate processing method includes: a catalyst layer forming process of forming a catalyst layer 91 on the impurity-doped polysilicon film 90 of the substrate W1 with the catalyst solution of the present disclosure; and an electroless plating process of forming, through the electroless plating processing, an electroless plating layer 92 on the catalyst layer 91 which is formed on the impurity-doped polysilicon film 90 of the substrate W1 by the catalyst layer forming process. In the present exemplary embodiment, the catalyst layer forming process and the electroless plating process are performed by a single plating unit 4. However, these two processes may be performed by separate processing units. An operation of the plating unit 4 is controlled by the controller 3.

First, as shown in FIG. 4A, there is prepared the substrate W1 having the base member S provided with the recess 9a and the impurity-doped polysilicon film 90 formed on the outermost layer of the one main surface side (main surface side where the recess 9a is formed) of the base member S.

In the present exemplary embodiment, the substrate having the base member S with the recess 9a, which is previously formed on the surface thereof, for forming the conductive layer and the impurity-doped polysilicon film 90 formed on the outermost layer of the one main surface side (main surface side where the recess 9a is formed) of the base member S is used as the substrate W1. However, the substrate processing method performed by the substrate processing apparatus 1 may include a processing of forming the recess 9a for forming the conductive layer on the base member S, a processing of forming the impurity-doped polysilicon film on one main surface (main surface where the recess 9a is formed) of the base member S directly or at the one main surface side with an intermediate layer (e.g., insulating film) therebetween, and so forth. As a method of forming the recess 9a on the impurity-doped polysilicon film 90, a commonly known method in the art may be appropriately employed. Specifically, as a dry etching technique, for example, a general-purpose technique using a fluorine-based gas or a chlorine-based gas may be employed. Especially, in order to form a hole having a high aspect ratio (hole depth/hole diameter), a method using an ICP-RIE (Inductively Coupled Plasma Reactive Ion Etching) technique, which can perform a deep etching process with a high speed, may be more appropriately adopted. Especially, a Bosch process in which an etching process using sulfur hexafluoride and a protection process using a fluorine-based gas such as $C_4F_8$ are repeatedly performed may be appropriately utilized.

The substrate W1 is carried into the plating unit 4. At this time, the transfer device 213 takes out the substrate W1 from the carrier C placed in the placing section 211 and places the substrate W1 in the delivery unit 214. The transfer device 222 takes out the substrate W1 from the delivery unit 214 and carries the substrate W1 into the plating unit 4.

The substrate W1 which is carried into the plating unit 4 is held by the substrate holding unit 42. At this time, the substrate holding unit 42 holds the substrate W1 on the turntable 422 horizontally while the edge portion of the substrate W1 is supported by the chuck 423. The driving unit 424 rotates the substrate W1 held by the substrate holding unit 42 at a preset speed. The controller 3 controls the driving unit 424 to adjust, e.g., a rotation timing and a rotation speed of the substrate W1.

In the plating unit 4, there is performed the catalyst layer forming process of processing the substrate W1 held by the substrate holding unit 42 with the catalyst solution L1 of the present disclosure. By the catalyst layer forming process, the catalyst layer 91 is formed on the impurity-doped polysilicon film 90 of the substrate W1, as shown in FIG. 4B. The catalyst solution L1 is the same as described above. By processing the substrate W1 with the catalyst solution L1 of the present disclosure, palladium atoms can be coupled to the impurity-doped polysilicon film of the substrate W1 without being aggregated, so that the catalyst layer 91 can be formed without performing the silane coupling processing.

In the catalyst layer forming process, while rotating the substrate W1 held by the substrate holding unit 42 at a preset speed, the nozzle 431a of the catalyst solution supply unit 43a is placed at a position above a center of the substrate W1, and the catalyst solution L1 is supplied onto the substrate W1 from the nozzle 431a. At this time, the controller 3 controls an operation of the catalyst solution supply unit 43a to adjust, e.g., a supply timing, a supply time and a supply amount of the catalyst solution L1. The catalyst solution L1 supplied onto the substrate W1 is diffused onto a surface of the impurity-doped polysilicon film 90 of the substrate W1 by a centrifugal force generated when the substrate W1 is rotated. As a result, the catalyst layer 91 is formed on the entire surface of the impurity-doped polysilicon film 90 of the substrate W1. The catalyst solution L1 scattered from the substrate W1 is drained through the drain opening 471b of the cup 47 and the liquid draining mechanism 49b. Upon the completion of the catalyst layer forming process, a substrate W2 is obtained.

It is desirable to perform a cleaning process on the substrate W1 in the plating unit 4 before the catalyst layer forming process is performed on the substrate W1. In the cleaning process, while rotating the substrate W1 held by the substrate holding unit 42 at a preset speed, the nozzle 431b of the cleaning liquid supply unit 43b is placed at the position above the central portion of the substrate W1, and the cleaning liquid L2 is supplied onto the substrate W1 from the nozzle 431b. At this time, the controller 3 controls the cleaning liquid supply unit 43b to adjust, e.g., a supply timing, a supply time and a supply amount of the cleaning liquid L2. The cleaning liquid L2 supplied on the substrate W1 is diffused onto the surface of the substrate W1 by a centrifugal force generated when the substrate W1 is rotated. As a result, contaminants or various kinds of processing liquids remaining on the substrate W1 are washed away. The cleaning liquid L2 is the same as described above. The cleaning liquid L2 scattered from the substrate W1 is drained through the drain opening 471c of the cup 47 and the liquid draining mechanism 49c.

Furthermore, it is desirable to perform the cleaning process on the substrate W2 in the plating unit 4 upon the completion of the catalyst layer forming process. In the cleaning process upon the substrate W2, the same process as conducted on the substrate W1 is performed.

Furthermore, it is desirable to perform a rinse process in the plating unit 4 before the catalyst layer forming process is performed after the cleaning process upon the substrate W1. In the rinse process, while rotating the substrate W1 held by the substrate holding unit 42 at a preset speed, the nozzle 431c of the rinse liquid supply unit 43c is located at the position above the central portion of the substrate W1, and the rinse liquid L3 is supplied onto the substrate W1 from the nozzle 431c. At this time, the controller 3 controls an operation of the rinse liquid supply unit 43c to adjust, e.g., a supply timing, a supply time and a supply amount of the rinse liquid L3. The rinse liquid L3 supplied on the substrate W1 is diffused onto the surface of the substrate W1 by a centrifugal force generated when the substrate W1 is rotated. As a result, the cleaning liquid L2 remaining on the substrate W1 is washed away. The rinse liquid L3 is the same as described above. The rinse liquid L3 scattered from the substrate W1 is drained through the drain opening 471c of the cup 47 and the liquid draining mechanism 49c.

In addition, it is desirable to perform a rinse process in the plating unit 4 before a next process is performed after the cleaning process upon the substrate W2. In this rinse process upon the substrate W2, the same rinse process as conducted on the substrate W1 is performed.

After the catalyst layer forming process (after the cleaning process and/or the rinse process in case that these processes are performed after the catalyst layer forming process), an electroless plating process of forming an electroless plating layer 92 on the catalyst layer 91 formed on the surface of the substrate W2 by the electroless plating processing is performed in the plating unit 4. Through the electroless plating process, the electroless plating layer 92 is formed on the catalyst layer 91, as depicted in FIG. 4C. In the electroless plating process, while rotating the substrate W2 held by the substrate holding unit 42 at a preset speed, the nozzle 451a of the plating liquid supply unit 45 is placed at a position above a central portion of the substrate W2, and the plating liquid M1 is supplied onto the substrate W2 from the nozzle 451a. At this time, the controller 3 controls an operation of the plating liquid supply unit 45 to adjust, e.g., a supply timing, a supply time and a supply amount of the plating liquid Ml. The plating liquid M1 supplied on the substrate W2 is diffused onto the surface of the substrate W2 by a centrifugal force generated when the substrate W2 is rotated. As a result, the electroless plating layer 92 is formed on the catalyst layer 91 which is formed on the surface of the substrate W2. The plating liquid M1 scattered from the substrate W2 is drained through the drain opening 471a of the cup 47 and the liquid draining mechanism 49a. Upon the completion of the electroless plating process, a substrate W3 is obtained.

The supply amount and the supply time of the plating liquid M1 in the electroless plating process are appropriately adjusted depending on a thickness of the electroless plating layer 92 to be formed. For example, by supplying the plating liquid M1 onto the substrate W2, an initial plating layer can be formed on the catalyst layer 91 which is formed on the surface of the substrate W2. By continuing to supply the plating liquid M1 onto the substrate W2, a plating reaction further progresses on the initial plating layer, so that the electroless plating layer 92 having a required thickness is obtained. The formed electroless plating layer 92 serves as a barrier layer configured to suppress a diffusion of a Cu plating layer that is formed in processes shown in FIG. 4D to FIG. 4F to be described later.

In the plating unit 4, it is desirable to perform a drying process of drying the substrate W3 after the electroless plating process. In the drying process, the substrate W3 may be dried naturally or may be dried by rotating the substrate W3 or by discharging a drying solvent or a drying gas to the substrate W3.

The substrate W3 obtained after performing the substrate processing in the plating unit 4 may be carried out from the plating unit 4, or may be subjected to an additional processing to be described later. In case that the substrate W3 is carried out from the plating unit 4, the transfer device 222 takes out the substrate W3 from the plating unit 4 and places the substrate W3 in the delivery unit 214. The transfer device 213 takes out the substrate W3 which is placed in the delivery unit 214 by the transfer device 222, and accommodates the substrate W3 in the carrier C of the placing section 211.

Now, an example of the additional processing that is performed on the substrate W3 after the substrate W3 is processed according to the substrate processing method performed by the substrate processing apparatus 1 will be explained with reference to FIG. 4D to FIG. 4F. FIG. 4D to FIG. 4F are schematic cross sectional views illustrating a substrate on which individual processings to be described later are performed after being processed according to the substrate processing method performed by the substrate processing apparatus 1. In FIG. 4A to FIG. 4F, the substrates W1 to W3 are the same as described above. Further, in FIG. 4A to FIG. 4F, a substrate obtained after forming an electroless Cu plating layer 93 on the electroless plating layer 92 of the substrate W3 by an electroless Cu plating process is referred to as "substrate W4"; a substrate obtained after filling the recess 9a of the substrate W4 with an electrolytic Cu plating 94 by an electrolytic Cu plating process while using the electroless Cu plating layer 93 on the substrate W4 as a seed layer is referred to as "substrate W5"; and a substrate obtained after chemically/mechanically polishing a rear surface side (i.e., opposite from the surface where the recess 9a is formed) of the substrate W5 is referred to as "substrate W6".

The substrate W3 (FIG. 4C) processed according to the substrate processing method performed by the substrate processing apparatus 1 may be subjected to a baking process of baking the electroless plating layer 92 after the electroless plating process in the plating unit 4. The baking process is performed by heating the substrate W3 on a hot plate within a sealed casing maintained in an inert gas atmosphere filled with an $N_2$ gas. Accordingly, the electroless plating layer 92 of the substrate W3 is baked. Desirably, a baking temperature for baking the electroless plating layer 92 may be in the range from 150° C. to 200° C., and a baking time may be in the range from 10 min to 30 min. By baking the electroless plating layer 92 on the substrate W3 as stated above, moisture within the electroless plating layer 92 can be removed, and, at the same time, intermetallic bonding within the electroless plating layer 92 can be improved.

Furthermore, after performing the baking process on the electroless plating layer 92, it may be possible to perform an electroless Cu plating process (FIG. 4D) of forming an electroless Cu plating layer 93 serving as a seed layer on the electroless plating layer 92, serving as the barrier layer, which is formed on the catalyst layer 91 by the electroless plating process. After the electroless Cu plating process is completed, the substrate W4 is obtained. Further, there may also be performed the electrolytic Cu plating process (FIG. 4E) of filling the recess of the substrate with the electrolytic Cu plating 94 by using the electroless Cu plating layer 93 as a seed layer. After the electrolytic Cu plating process is completed, the substrate W5 is obtained. In addition, a chemical/mechanical polishing process (FIG. 4F) of chemically/mechanically polishing the rear surface side (opposite from the surface where the recess 9a is formed) of the substrate W5 may also be performed. After the chemical/mechanical polishing process is finished, the substrate W6 is obtained.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A substrate processing method of performing a plating processing on a substrate having, on a surface thereof, an impurity-doped polysilicon film, the substrate processing method comprising:
   forming a catalyst layer by supplying, onto the substrate, an alkaline catalyst solution containing a complex of a palladium ion and a heterocyclic compound and allowing palladium atoms to be coupled to the impurity-doped polysilicon film without being aggregated; and
   forming a plating layer through electroless plating by supplying a plating liquid onto the substrate after the forming of the catalyst layer,
   wherein the impurity-doped polysilicon film contains impurities and a number of atoms as the impurities is equal to or higher than $10^{15}/cm^3$ of the impurity-doped polysilicon film, and
   the heterocyclic compound is selected from a group consisting of pyrroline, pyrrole, imidazoline, imidazole, pyrazoline, pyrazole, pyrrolidine, imidazolidine, pyrazolidine and piperidine.

2. The substrate processing method of claim 1,
wherein the substrate further includes a base member and an insulating film formed between the base member and the impurity-doped polysilicon film.

3. The substrate processing method of claim 1,
wherein the heterocyclic compound has a substituent selected from a group consisting of a hydroxyl group, a carboxyl group and a sulfate group.

4. A substrate processing method of performing a plating processing on a substrate having, on a surface thereof, an impurity-doped polysilicon film, the substrate processing method comprising:
   forming a catalyst layer by supplying, onto the substrate, an alkaline catalyst solution containing a complex of a palladium ion and a heterocyclic compound and allowing palladium atoms to be coupled to the impurity-doped polysilicon film without being aggregated; and
   forming a plating layer through electroless plating by supplying a plating liquid onto the substrate after the forming of the catalyst layer,
   wherein the impurity-doped polysilicon film contains impurities and a number of atoms as the impurities is equal to or higher than $10^{15}/cm^3$ of the impurity-doped polysilicon film, and
   the heterocyclic compound is selected from a group consisting of pyrroline, imidazoline, pyrazoline, imidazolidine and pyrazolidine.

* * * * *